United States Patent
Ostermayr

(10) Patent No.: US 6,906,942 B2
(45) Date of Patent: Jun. 14, 2005

(54) PROGRAMMABLE MASK ROM BUILDING ELEMENT AND PROCESS OF MANUFACTURE

(75) Inventor: Martin Ostermayr, Feldkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/717,781

(22) Filed: Nov. 20, 2003

(65) Prior Publication Data

US 2004/0136222 A1 Jul. 15, 2004

(30) Foreign Application Priority Data

Nov. 20, 2002 (DE) .......................................... 102 54 155

(51) Int. Cl.⁷ .............................................. G11C 17/00
(52) U.S. Cl. .......................................... 365/104; 365/94
(58) Field of Search .......................... 365/104, 94, 103, 365/63

(56) References Cited

U.S. PATENT DOCUMENTS

| | | | |
|---|---|---|---|
| 5,350,703 A | 9/1994 | Lee | |
| 5,471,416 A | 11/1995 | Azmanov | |
| 5,514,609 A | 5/1996 | Chen et al. | |
| 5,663,903 A | * 9/1997 | Guo | 365/104 |
| 5,917,224 A | 6/1999 | Zangara | |
| 5,959,877 A | * 9/1999 | Takahashi | 365/104 |
| 6,107,666 A | 8/2000 | Chang | |
| 6,146,950 A | 11/2000 | Sheu et al. | |
| 6,355,550 B1 | * 3/2002 | Parris et al. | 438/599 |
| 2002/0042182 A1 | 4/2002 | Parris et al. | |
| 2002/0091894 A1 | 7/2002 | Garg | |

FOREIGN PATENT DOCUMENTS

| | | |
|---|---|---|
| DE | 42 26 421 A1 | 3/1993 |
| DE | 100 05 460 A1 | 1/2001 |
| JP | 4-276659 | 10/1992 |
| JP | 11-135651 | 5/1999 |

OTHER PUBLICATIONS

"A New Contact Programming ROM Architecture for Digital Signal Processor", Hiroshi Takahashi, Shigetoshi Muramatsu and Masayasu Itoigawa, 1998 Symposium on VLSI Circuits Digest of Technical Papers, IEEE, 1998, 5 pages.
"An 80 ns 1 Mbit Mask ROM with a New Memory Cell", Fujio Masuoka, Shoji Ariizumi, Taira Iwase, Michihiro Ono and Norio Endo, IEEE Journal of Solid–State Circuits, vol. SC–19, No. 5, Oct., 1984, 8 pgs.

* cited by examiner

Primary Examiner—Anh Phung
(74) Attorney, Agent, or Firm—Eschweiler & Associates LLC

(57) ABSTRACT

A semiconductor memory component such as a mask-programmable ROM component, has two memory cell transistors adjacent to each other in one column of a memory cell field. First and a second row-select/potential-equalization lines are equidistant from the two memory cell transistors and vertically above a diffusion region, which is assigned to both memory cell transistors. The first or the second row-select/potential-equalization line can be connected both to the word line of the first memory cell transistor and to the word line of the memory cell transistor of the second memory cell for equalizing the potential with one of the two word lines.

18 Claims, 5 Drawing Sheets

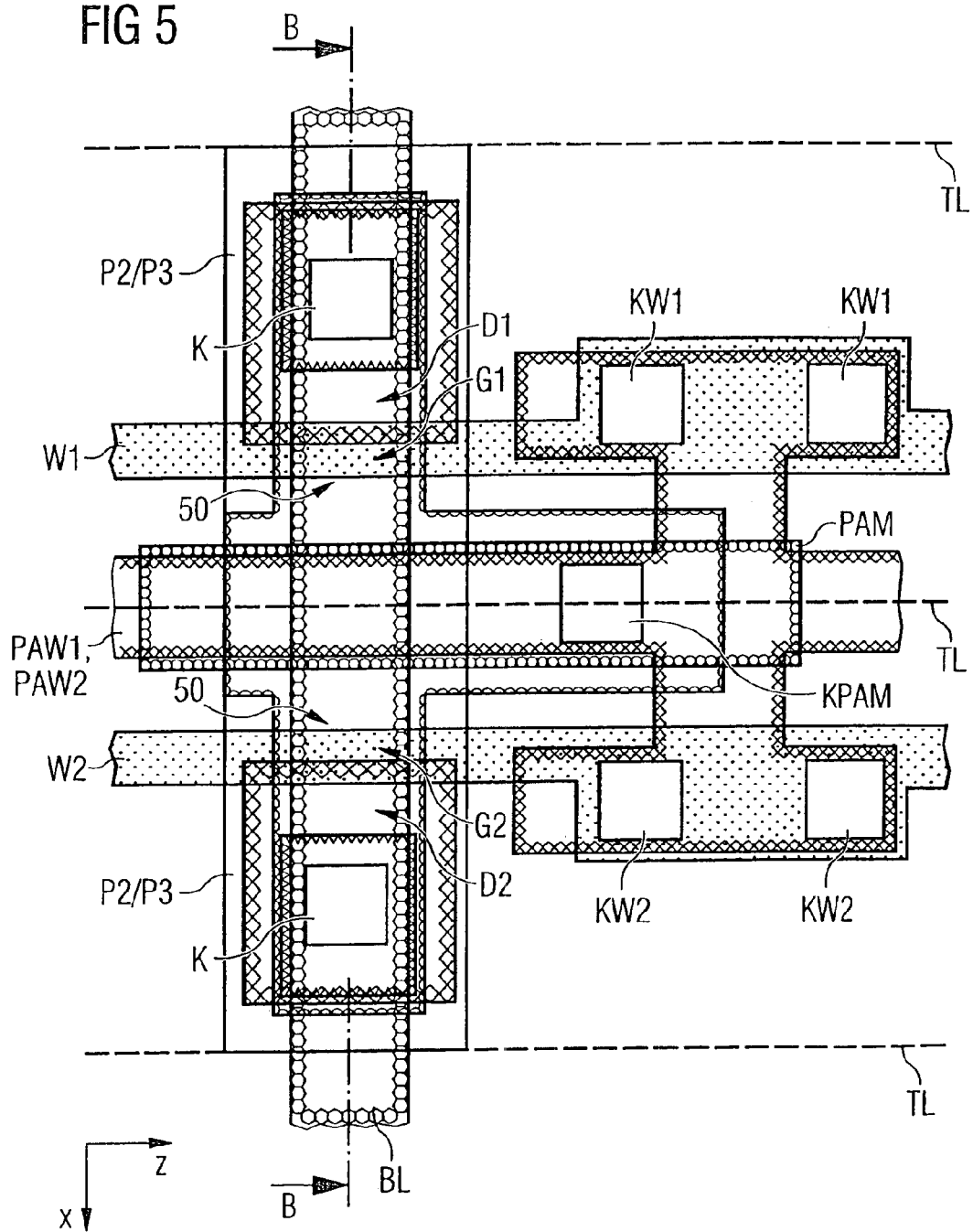

PROGRAMMABLE MASK ROM BUILDING ELEMENT AND PROCESS OF MANUFACTURE

REFERENCE TO RELATED APPLICATIONS

This application claims the benefit of the priority date of German application DE 102 54 155.8, filed on Nov. 20, 2002, the contents of which are herein incorporated by reference in their entirety.

FIELD OF THE INVENTION

The invention pertains to a semiconductor memory component, for example, a read-only memory component, and more particularly to a mask-programmable ROM component, and to a process for the production of such a ROM component.

BACKGROUND OF THE INVENTION

Semiconductor memory devices, that is, semiconductor components with at least one memory cell, are used to store data in digital systems. In correspondence with the type of data storage and the various ways in which the data can be written and read-out again, these semiconductor memory devices are divided into various categories. If the memory device continues to store the information even after the supply voltage has been turned off, the device is a non-volatile memory (read-only memory), such as a ROM device. The category of volatile memory devices includes static and dynamic memories such as SRAM (Static Random Access Memory) and DRAM (Dynamic Random Access Memory). After production, data can be freely written to and read from these volatile memory components. In contrast, data cannot usually be written to the non-volatile memory components after they have been produced, and they are therefore used essentially only as sources from which data can be read.

Read-only memories (ROM's) are used in digital systems to store constants, control data, and program instructions. The information is stored by providing transistors at the intersections between the word lines and the bit lines to connect the word lines to the bit lines or by not providing any transistors there so as not to connect the two types of lines. These MOS (Metal Oxide Semiconductor) transistors are arranged in the form of a matrix in a memory field region of the ROM component.

The cells for a MOS-ROM component (Metal Oxide Semiconductor Read-Only-Memory) require only one transistor to store a bit. In one possible design, namely, that of an n-channel transistor, the source region is connected to ground ("low potential"). To store a bit ("high" or "low" potential), an electrical contact is placed in the drain region of the transistor to establish an electrical connection between the transistor and the bit line (BL). When the word line (WL), which represents the gate of the transistor, is now opened, "low potential" can flow from the source region to the drain region and can be read via the bit line. As a result, the 1-bit ROM memory cell is programmed to the logical state "0". To program the "high potential", the electrical contact between the drain region of the transistor and the bit line is omitted. The bit line is therefore undefined, and the 1-bit ROM memory cell is programmed to the other logical state "1".

In accordance with the complexity of the system, the memory requirement can range from only a few bits to many billions of bits. If relatively little memory is required, the memory devices are integrated as modules into a chip along with the data paths and control logic. If it is necessary to store large amounts of data, standardized units are produced. The criteria under which standard memory units are evaluated are cost (and thus complexity), speed of access to the data, power loss, and reliability.

Read-only memories or ROM components differ with respect to whether the data are written into them by electrical pulses during the production process or after production. The ROM components considered within the scope of the state of the art, in which the data are written into the devices during production, are called "mask-programmable ROM components". Depending on the method used to encode the data during production, mask-programmable ROM's can be either of the diffusion type, of the contact type, or of the via-contact type.

For ROM's of the diffusion type, programming is carried out by forming or omitting transistors at the intersections between the word lines and the bit lines in correspondence with the data to be stored. The encoding or programming therefore takes place at a very early stage of the production process. For this type of ROM, many additional process steps are required after programming to finish the memory component, and as a result the "turn-around-times" are long. The turn-around-time is the time the customer must wait for delivery of the finished product after he has provided the manufacturer with his specifications for the desired mask-programmable ROM.

In ROM's of the contact type, the memory cells are programmed by creating or leaving out the electrical contacts between the memory cell transistors and the bit lines located in the first metallization plane above the memory cell transistors. In the via-contact type, the programming is shifted to a higher metallization plane. Because of the different arrangements of the word lines and bit lines required in the via-contact and contact types, however, the amount of surface area required is greater than that for the diffusion type. The data in these memory components known as "mask-programmable ROM's" cannot be erased or overwritten.

In the case of mask-programmable ROM's, it is especially desirable to minimize the so-called "turn-around-time" (TAT) or "cycle time". Efforts are always being made to reduce this turn-around-time. At the same time, it is desirable to minimize the amount of space required by the memory cells.

A mask-programmable ROM component is disclosed in U.S. Pat. No. 5,959,877, in which the programming can be carried out in the second, third, or a higher metallization plane. The transistors are arranged in the form of a matrix in the memory cell field, thus forming rows and columns. The transistors arranged in one row are connected to the same word line. The transistors arranged in adjacent columns are connected by their gate terminals to different word lines. Only the diffusion regions of the two outer transistors of a column, i.e., the diffusion regions facing the edge of the memory cell field, are connected to ground potential. All of the other diffusion regions, each of which is assigned to two transistors, can be contacted by the bit lines situated above them. The transistors are therefore connected in series between the potentials of the word lines, and the diffusion regions of adjacent transistors are connected to several potential nodes. Although it is true that the cycle time can be kept relatively short by shifting the programming into a higher metallization plane, this wiring design requires a very large amount of space to accommodate the complicated configuration and layout of the word lines and bit lines.

In the case of mask-programmable ROM cell fields, word lines are usually produced out of polysilicon. Because polysilicon lines have a high resistance value, it is advantageous to amplify the signals on these polysilicon lines or to adjust them to the required signal strength by means of an additional line in one of the metallization layers, especially when the memory cell field has a very large number of memory cells and it is therefore impossible to avoid a drop in the potential along the transistors connected to one word line.

An arrangement of lines of this type for row selection and potential equalization is shown in FIG. 1. FIG. 1 shows two memory cell transistors, which are arranged next to each other in a column of a memory cell field. The first memory cell has a first memory cell transistor, the gate G1 of which is connected to a first word line W1. Via its drain terminal D1, this first memory cell transistor is contacted by a bit line BL, i.e., programmed to the first state, by way of a contact K, a first contact path P1 in a first metallization plane, a first via connection V1, a second contact path P2 in a second metallization plane, and a second via connection V2. A source region 50 is assigned to the first and to the second memory cell transistor. The second memory cell transistor is designed in the same way as the first memory cell transistor. The separating lines TL designate the boundaries of a memory cell and characterize the unit cell.

To equalize the mass potential, to which the source region 50 is connected, a ground potential equalization line PAM is provided, with which the source region 50 can be brought into contact. For row-select/potential-equalization, each memory cell has its own electrical row-select/potential-equalization line PAW1 or PAW2, where the two row-select/potential-equalization lines PAW1 and PAW2 are formed in a metallization plane above the bit line BL. These row-select/potential equalization lines PAW1 and PAW2 are therefore produced only after the memory cells have been programmed, which has the effect of prolonging not only the process of producing the mask-programmable ROM's but also the overall cycle time.

SUMMARY OF THE INVENTION

The task of the invention is to create a semiconductor component and a process for its production according to which both the amount of space required and the turn-around-times are minimized. In particular, programming is to be done in the latest possible stage of the production process, while at the same time the arrangement of the word lines and bit lines, especially the row-select/potential-equalization lines, is to be optimized.

A semiconductor memory component according to the invention has a first and a second memory cell transistor and a first and a second row-select/potential-equalization line. The first memory cell transistor is electrically connected to a first selection line, and the second memory cell transistor is electrically connected to a second selection line. One aspect of the invention is that the first row-select/potential-equalization line and the second row-select/potential-equalization line are arranged vertically with respect to each other, between the two memory cell transistors. The semiconductor memory component is designed in one example as a ROM component, such as a mask-programmable ROM (Read-Only Memory) component. As a result of the arrangement according to the invention of the two row-select/potential-equalization lines, the amount of space required by the component can be significantly reduced. In that the row-select/potential-equalization lines are at different distances in the vertical direction from the memory cell transistors, the memory cell field and thus also the semiconductor memory component can be significantly reduced in size.

In one exemplary embodiment, at least one of the two row-select/potential-equalization lines is equidistant from the two memory cell transistors or from the selection lines, which are designed in particular as the first and second word lines. As a result, the row-select/potential-equalization line can be assigned to two memory cell transistors adjacent to each other in one column of a memory cell field. At least one of the two row-select/potential-equalization lines is therefore equidistant from the two memory cell transistors. As a result of this optimized arrangement of the first row-select/potential-equalization line, it also becomes possible to optimize the arrangement of all the other electrical lines required for the overall memory component, specifically the data lines and the word lines. In particular, these other required electrical lines can be laid out in such a way that the programming of the semiconductor memory component can be carried out at a relatively late point in the overall fabrication process.

In another exemplary embodiment, at least one of the two row-select/potential-equalization lines is arranged essentially vertically above and centered over a diffusion region of the memory cell transistors. This diffusion region, above which at least one of the row-select/potential-equalization lines is located, is assigned to both the first and the second memory cell transistor. As a result, it is a simple matter to establish contact with the first or with the second memory cell transistor or with the word lines.

It is especially advantageous for the first and the second row-select/potential-equalization line to be arranged one above the other, so that they are essentially coincident in the vertical direction. The amount of space required for the memory cell can thus be reduced in an especially effective manner, because, in practice, the area which can be eliminated in the case of two adjacent memory cell fields will always be that area—as seen when looking down onto the memory cell field from above—which would have to be provided on the basis of the applicable design rules between the two row-select/potential-equalization lines if they were to be arranged horizontally next to each other (as in the state of the art).

It is also advantageous for the two row-select/potential-equalization lines to be provided in different metallization planes.

It is possible, in one exemplary option, for the first row-select/potential-equalization line to be provided in the second or the third metallization plane above the first and the second memory cell transistor. The second row-select/potential-equalization line would then be formed accordingly in the third or second metallization plane. An especially space-saving design can be obtained by arranging the two row-select/potential-equalization lines vertically one above the other so that they are symmetrical to the two memory cell transistors in one column.

It is advantageous for the first or the second row-select/potential-equalization line to be able to contact the first memory cell transistor and in a corresponding manner for the second or the first row-select/potential-equalization line to be able to contact the second memory cell transistor. Each of the two row-select/potential equalization lines can therefore be used to contact the two memory cell transistors adjacent to each other in one column of a memory cell field. As a result of the inventive arrangement of these two row-select/potential-equalization lines, a high level of flexibility and efficiency with respect to the contacting, i.e., potential equalization, of the memory cell transistors can be achieved. At the same time, a significant amount of space can be saved by the clever arrangement of these row-select/potential-equalization lines, and the arrangement of the other electrical lines required for the semiconductor memory component can also be designed in a much more highly simplified manner, so that the programming of the semiconductor memory component can be shifted chronologically to a point far down the sequence of fabrication processes.

For potential equalization, it is advantageous for the row-select/potential-equalization lines to be designed to equalize the potentials present at a first and a second word line. The gate region of the first memory cell transistor is electrically connected to the first word line, whereas the gate region of the second memory cell transistor is connected electrically to the second word line. The two row-select/potential-equalization lines can be contacted by these word lines of the memory cell transistors.

It is preferable for the first and the second memory cell transistor to be able to contact a data line, which is designed in particular as a bit line, for the programming of the memory states. The data line is formed in a metallization plane which, seen from the perspective of the memory cell transistors, lies above the metallization planes in which the first and the second row-select/potential-equalization lines are located. The semiconductor memory component is thus programmed after the row-select/potential-equalization lines have been formed.

In another embodiment, the semiconductor memory component has a memory cell field, in which a plurality of memory cells is arranged in the form of a matrix. The memory cell field has at least one first and one second row; in both the first and the second rows there is a plurality of memory cells, each with a memory cell transistor. The memory cell transistors of the first row are electrically connected to a first selection line, and the memory cell transistors of the second row are electrically connected to a second selection line. The first selection line is electrically connected only to the first row-select/potential-equalization line at a distance of l memory cell transistors of the first row. The second selection line is connected electrically only to the second row-select/potential-equalization line at a distance of k memory cell transistors of the second row. The whole numbers l and k are much smaller than the total number of memory cell transistors present in each case on the first and second selection lines. It is possible, for example, for the potential to be equalized on the word line over a distance of 8 transistors of one row.

It is also possible for both the first and the second word line to have at least one electrical connection to the first row-select/potential-equalization line and an electrical connection to the second row-select/potential-equalization line. For example, the first selection line or word line can be connected to the first row-select/potential-equalization line after l memory cell transistors of the first row and, for example, to be electrically connected to the second row-select/potential-equalization line after 2l memory cell transistors of the first row. In analogous fashion, the second selection line or word line can be electrically connected to the second row-select/potential-equalization line after k memory cell transistors and to the first row-select/potential-equalization line after 2k memory cell transistors.

In the case of a process according to the invention for the production of a semiconductor memory component which is designed in particular as a ROM component, such as a mask-programmable ROM component, a first and a second memory cell transistor are produced in a substrate, and the first memory cell transistor is electrically connected to a first selection line, and the second memory cell transistor is electrically connected to a second selection line, for example, a first and a second word line. A first and a second row-select/potential-equalization line are formed vertically one above the other, between the two memory cell transistors. As a result, a semiconductor memory component with a much smaller space requirement can be obtained.

In an advantageous exemplary embodiment, at least one of the two row-select/potential-equalization lines is designed to be equidistant from the two memory cell transistors or from the two selection lines. The row-select/potential-equalization line is thus arranged in an especially space-saving manner, which is especially advantageous for the following fabrication process.

The amount of space required for the semiconductor memory components can be considerably reduced in terms of surface area and the turn-around-time can also be significantly reduced because the programming of the memory states can be performed at a relatively late point in the fabrication process. In addition, the arrangement of the other electrical lines required for the semiconductor memory component can be optimized as a result of the optimized arrangement of the row-select/potential-equalization lines.

It is preferable for at least one of the two row-select/potential-equalization lines to be centered vertically above the diffusion region assigned to the first and second memory cell transistors.

It is preferable for the first and the second row-select/potential-equalization lines to be arranged one above the other, so that they are coincident in the vertical direction; the first and the second row-select/potential-equalization lines can be formed in different metallization planes. In particular, it is possible for the first row-select/potential-equalization line to be formed in a second or a third metallization plane above the memory cell transistors and for the second row-select/potential-equalization line to be formed correspondingly in the third or second metallization layer.

The semiconductor memory component can be programmed by forming electrical contacts, especially by means of via connections, with a data line produced in a fourth or higher metallization plane. The data line, especially a bit line, is formed in a metallization plane which is produced above the metallization planes in which the row-select/potential-equalization lines are produced.

As a result of the inventive arrangement and the inventive formation of the row-select/potential-equalization lines, it is possible to acquire an additional programming plane, so to speak, in that programming now takes place in a metallization plane which is located above the metallization plane of the row-select/potential-equalization lines and in particular takes place in the last metallization plane with a thin cross section. The "last thin metallization plane" is the last metallization plane required for the formation of the electrical lines needed for the semiconductor memory component. Only one or more comparatively thick metallization planes are formed above this last thin metallization plane; these thick planes are used for bonding the semiconductor memory component, for example, or for electrically connecting the semiconductor memory component to the outside. Because these top or final metallization planes are thicker than the first metallization planes, they are no longer suitable as programming planes.

BRIEF DESCRIPTION OF THE DRAWINGS

An exemplary embodiment of the invention is explained in greater detail below on the basis of schematic diagrams:

FIG. 5 shows a plan view or layout of the semiconductor memory component according to the invention as shown in FIG. 4.

DETAILED DESCRIPTION OF THE INVENTION

The same or functionally equivalent elements in the figures are designated by the same reference numbers.

Figure 2:
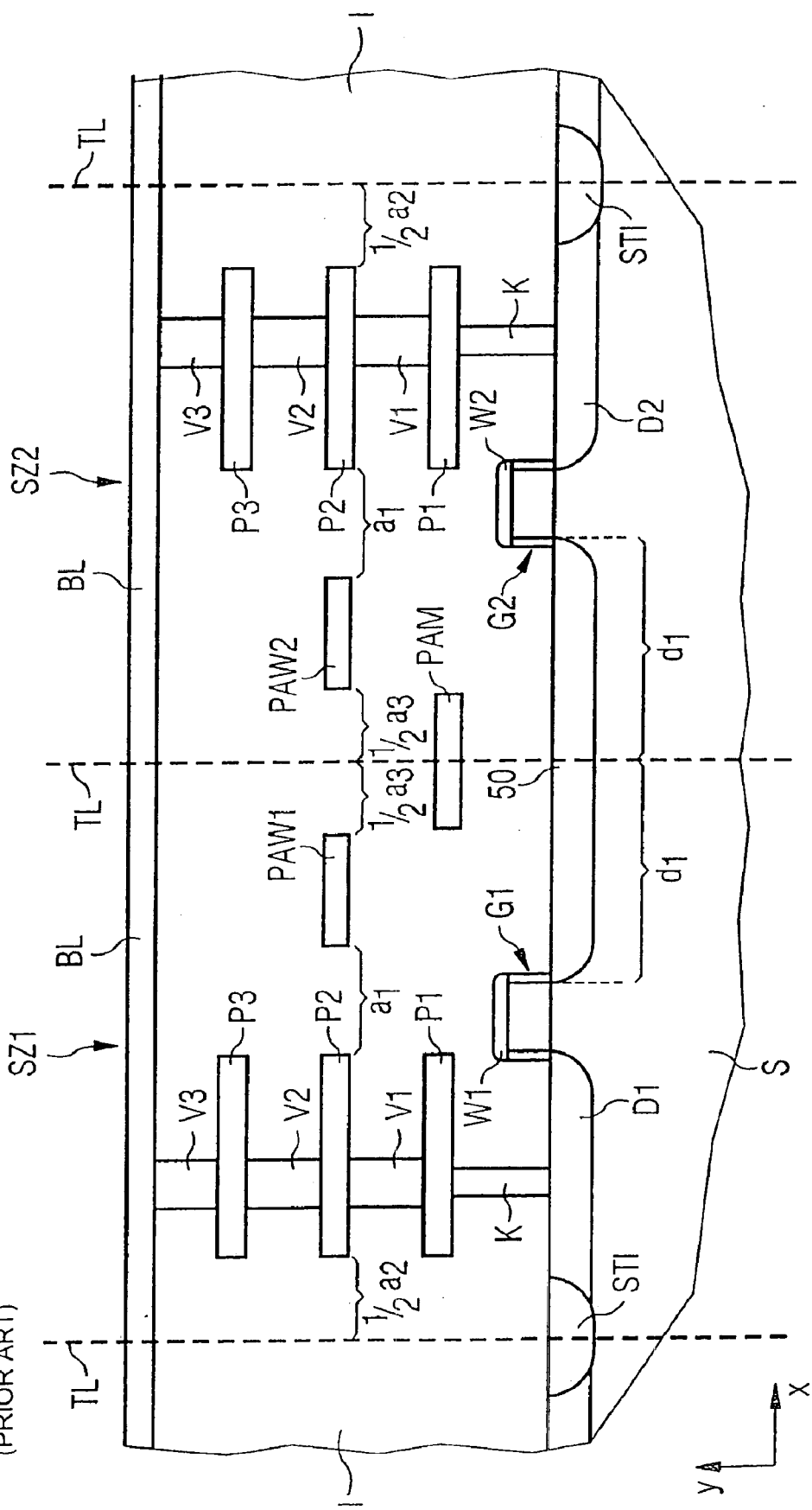
FIG. 2 shows a cross-sectional view of another design of a semiconductor memory component according to the state of the art.

FIG. 2 shows another embodiment of a semiconductor memory component according to the state of the art with row-select/potential-equalization lines. In this known memory cell design, a row-select/potential-equalization line is assigned to each of the two memory cells SZ1 and SZ2 (unit cell characterized by the regions between two separating lines TL). The row-select/potential-equalization line PAW1 is assigned to the first memory cell SZ1. The second row-select/potential-equalization line PAW2 is provided in the second memory cell SZ2 and is assigned exclusively to this memory cell SZ2. The two row-select/potential-equalization lines PAW1 and PAW2 are formed in the same metallization plane; in the example shown here, they are formed in the second metallization plane. The bit line BL in this exemplary embodiment is located above the row-select/potential-equalization lines PAW1 and PAW2.

To equalize the potentials present at the word lines W1 and W2, the word line W1 can be contacted only by the row-select/potential-equalization line PAW1 formed in first memory cell SZ1. In similar fashion, the word line W2 in the second memory cell SZ2 can be contacted only by the second row-select/potential-equalization line PAW2 formed in this memory cell SZ2. On the basis of the applicable design rules (lithography tools, component simulations, dopant adjustments, chemical processing steps, optical effects, use of different masks), by which the technology in question is characterized and which must be taken into account in the development and production of a semiconductor component of this type, the various regions of the semiconductor component must be certain distances apart. Depending on the corresponding technology and the subregions being considered within a semiconductor memory component between which it is necessary to maintain a certain minimum distance, these minimal distances specified by the design rules range from a few hundredths to a few tenths of a μm.

In FIG. 2, therefore, one of the minimum distances which must be maintained is the distance $a_1$ between the contact pad P2 in the first memory cell SZ1 and the first line select/potential equalization line PAW1. In addition, a minimum distance equivalent to one-half of $a_2$ must also be maintained between the separating line TL and the contact pad P2 of the first memory cell SZ1; and a minimum distance equivalent to one-half of $a_3$ must be maintained between the second separating line TL, forming the boundary of first memory cell SZ1, and the first row-select/potential-equalization line PAW1. The second memory cell SZ2 is designed in the same way as the first memory cell SZ1, as a result of which a total minimum distance $a_3$ is present between the two row-select/potential-equalization lines PAW1 and PAW2. These predetermined minimum distances $a_1$, $a_2$, and $a_3$, which cannot be made any smaller than specified during the development of the semiconductor memory component, limit both the degree of miniaturization and thus also the degree to which the amount of surface area required for a semiconductor component can be reduced, especially when two row-select/potential-equalization lines PAW1 and PAW2 are designed in the manner shown in FIG. 2.

Figure 3:
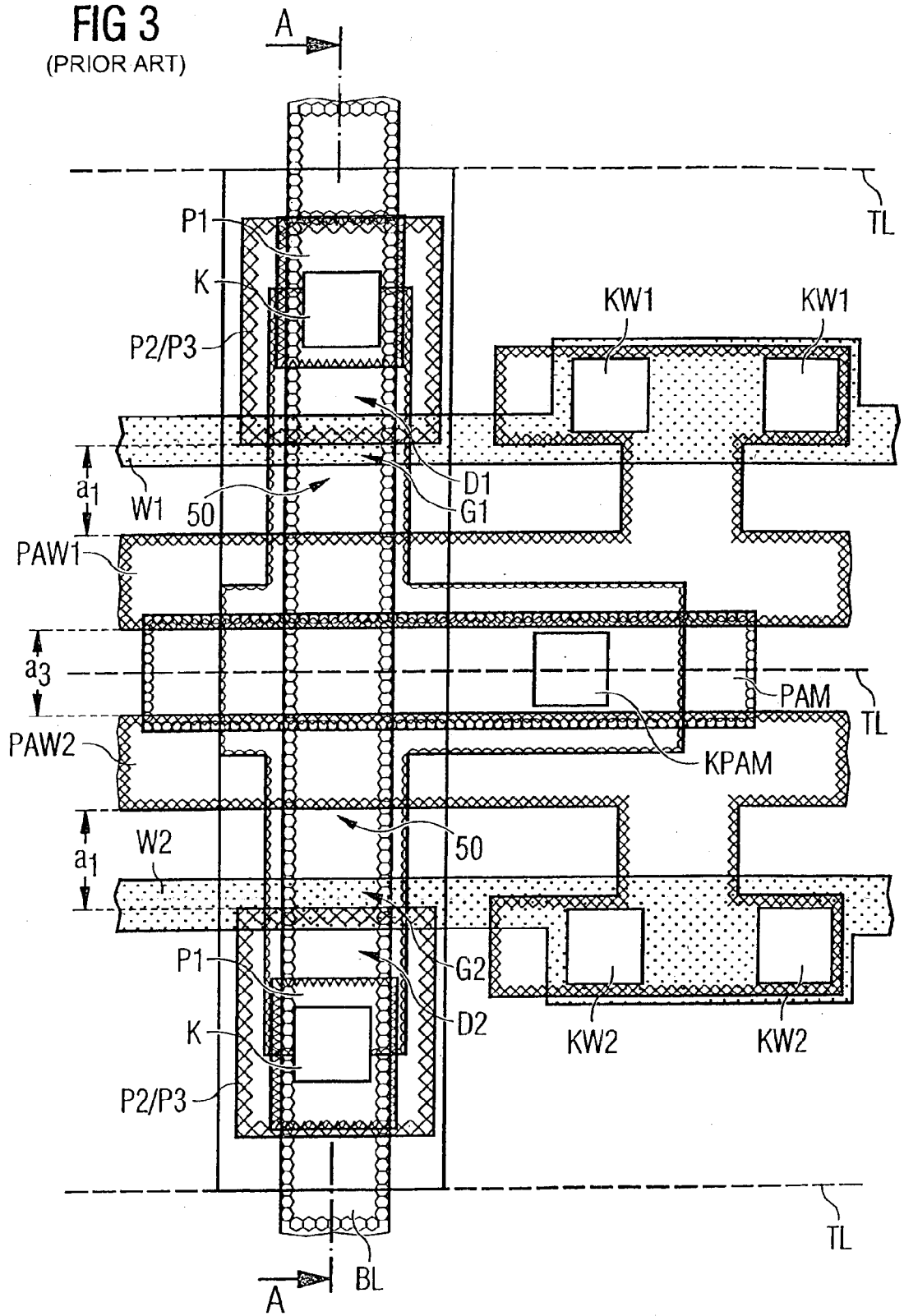
FIG. 3 shows a plan view or layout of the arrangement according to FIG. 2.

FIG. 3 shows a plan view or layout of the known semiconductor memory component according to FIG. 2. FIG. 2 represents a cross-sectional view of the component along line AA of FIG. 3. FIG. 3 also shows that the minimum distances $a_3$ and $a_1$, that is, the minimum distance between the row-select/potential-equalization lines PAW1 and PAW2 and the minimum distance between each of the row-select/potential-equalization lines PAW1 and PAW2 and the corresponding contact pads P2, require a relatively large amount of surface area on the semiconductor memory component. In FIG. 3, the contact pads P2 and P3 are drawn as rectangular contact pads to simplify the diagram and to make it easier to understand. In addition, FIG. 3 also shows how the first row-select/potential-equalization line PAW1 is contacted by the first word line W1 of the first memory cell. The first row-select/potential-equalization line PAW1 has a T-shaped region oriented toward the word line W1; this region is contacted by the word line via the two contact areas KW1. In similar fashion, the second row-select/potential-equalization line PAW2 is electrically contacted by the second word line W2 of the second memory cell via the contact areas KW2. The ground potential equalization line PAM is contacted by the common diffusion region of the two memory cell transistors via the contact area KPAM.

Figure 4:
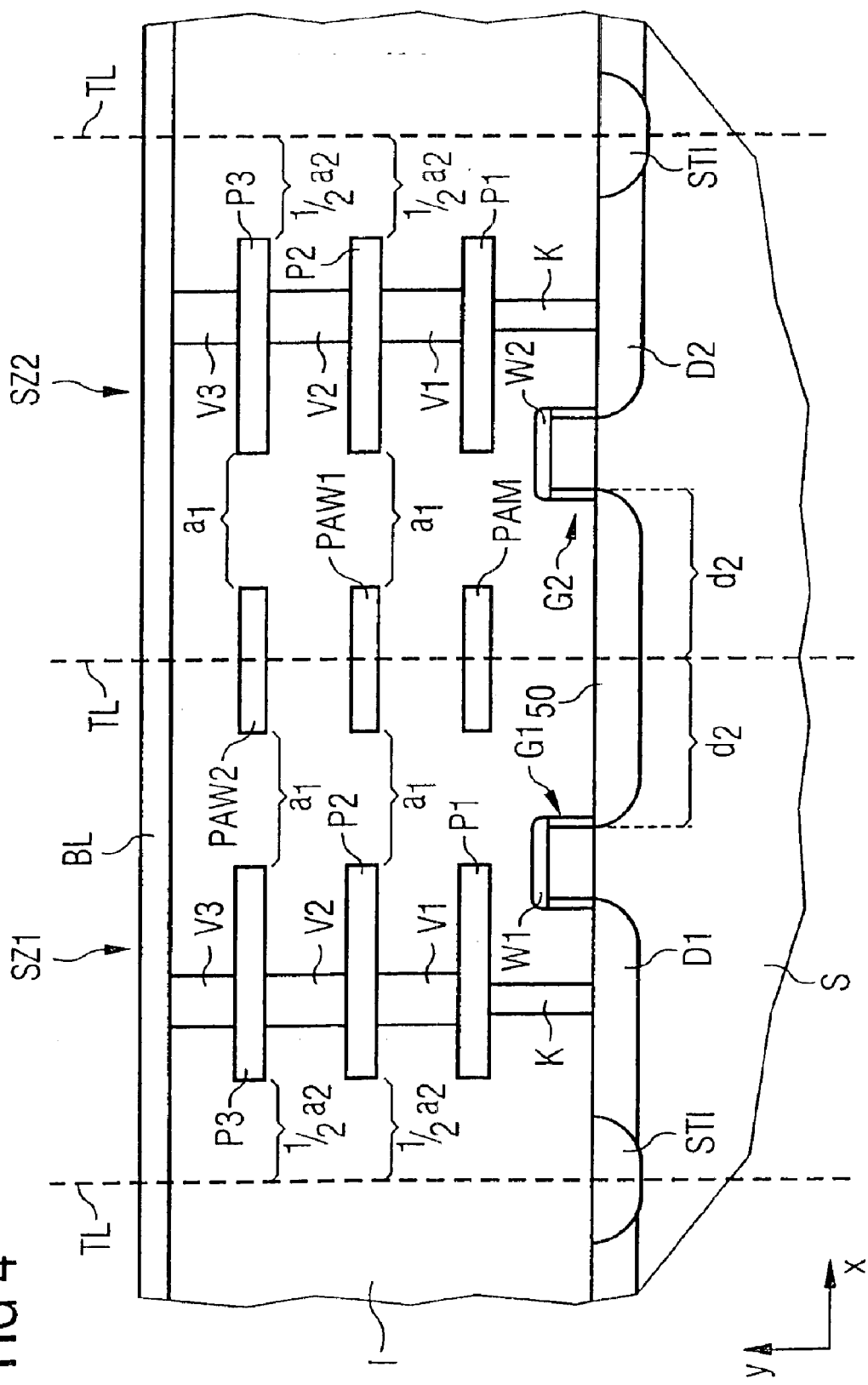
FIG. 4 shows a cross-sectional view of a semiconductor component according to the invention.

A semiconductor memory component according to the invention in the form of a mask-programmable ROM component is shown in cross section in FIG. 4. Both the first row-select/potential-equalization line PAW1, i.e., the word line/potential-equalization line PAW1, and the second row-select/potential-equalization line PAW2, i.e., the word line/potential-equalization line PAW2, are arranged symmetrically relative to the separating line TL between the two memory cells SZ1 and SZ2, above the common source region 50 of the memory cell transistors. The two row-select/potential-equalization lines PAW1 and PAW2 thus extend into more than one memory cell, being located in part in both the first and the second memory cell SZ1 and SZ2, and they are essentially laterally equidistant from the word lines WL1 and WL2. The first row-select/potential-equalization line PAW1 is in the second metallization plane, whereas the second row-select/potential-equalization line PAW2 is in the third metallization plane. For the potential equalization of the first word line W1 ("wordline refresh"), it is thus possible for electrical contact to be established both with the first row-select/potential-equalization line PAW1 and with the second row-select/potential-equalization line PAW2.

In analogous fashion, a potential equalization ("wordline refresh") of the second word line W2 can be achieved by forming an electrical connection with the first PAW1 or with the second row-select/potential-equalization line PAW2. As can be seen in FIG. 4, the minimum distance $a_1$, predetermined by the design rules, namely, the distance between the contact areas P2 and the first row-select/potential-equalization line PAW1 and between the contact areas P3 and the second row-select/potential-equalization line PAW2, must be maintained. As a result of the inventive arrangement of these row-select/potential-equalization lines PAW1 and PAW2, however, both the first memory cell SZ1 and the second memory cell SZ2 can be reduced in size in the x-direction by half of the minimum distance $a_3$. The semiconductor memory component according to the invention shown in FIG. 4 with the two memory cells SZ1 and SZ2 arranged next to each other in one column can therefore be made smaller in the x-direction than the semiconductor memory component according to FIG. 2 according to the state of the art by an amount equivalent to a width of an equalization line and the minimum design rule distance $a_3$.

As a result of the vertical arrangement of the row-select/potential-equalization lines PAW1 and PAW2, it is also possible to reduce the size of the source region 50, which has a dimension $d_2$ in the lateral direction in each of the first and second memory cells SZ1 and SZ2. This reduction in the lateral dimension of the source region 50 in each of the memory cells SZ1 and SZ2 from $d_1$ (FIG. 2) to the lateral dimension $d_2$ (FIG. 4) corresponds essentially to a half of the minimum design rule distance $a_3$. As also shown in FIG. 4, the drain region D1 and D2 of the memory cell transistors of the memory cells SZ1 and SZ2 are isolated from the adjacent drain regions of the adjacent transistors (not shown completely) by shallow trench isolation areas STI. The memory cells in FIG. 4 are programmed by forming via connections V3 to the bit line BL in the fourth metallization plane. In the exemplary embodiment shown here, the two memory cells, i.e., the drain regions D1 and D2, are electrically contacted by the bit line BL. The two memory cells SZ1 and SZ2 have a first logical state, which is called "0" by convention. If, for example, the electrical connection between the contact pad P3 and the bit line BL were to be absent in the memory cell SZ1, that is, if the via connection V3 had not been produced, this memory cell SZ1 would have a second logical state, namely the state called "1" by convention.

Figure 1:
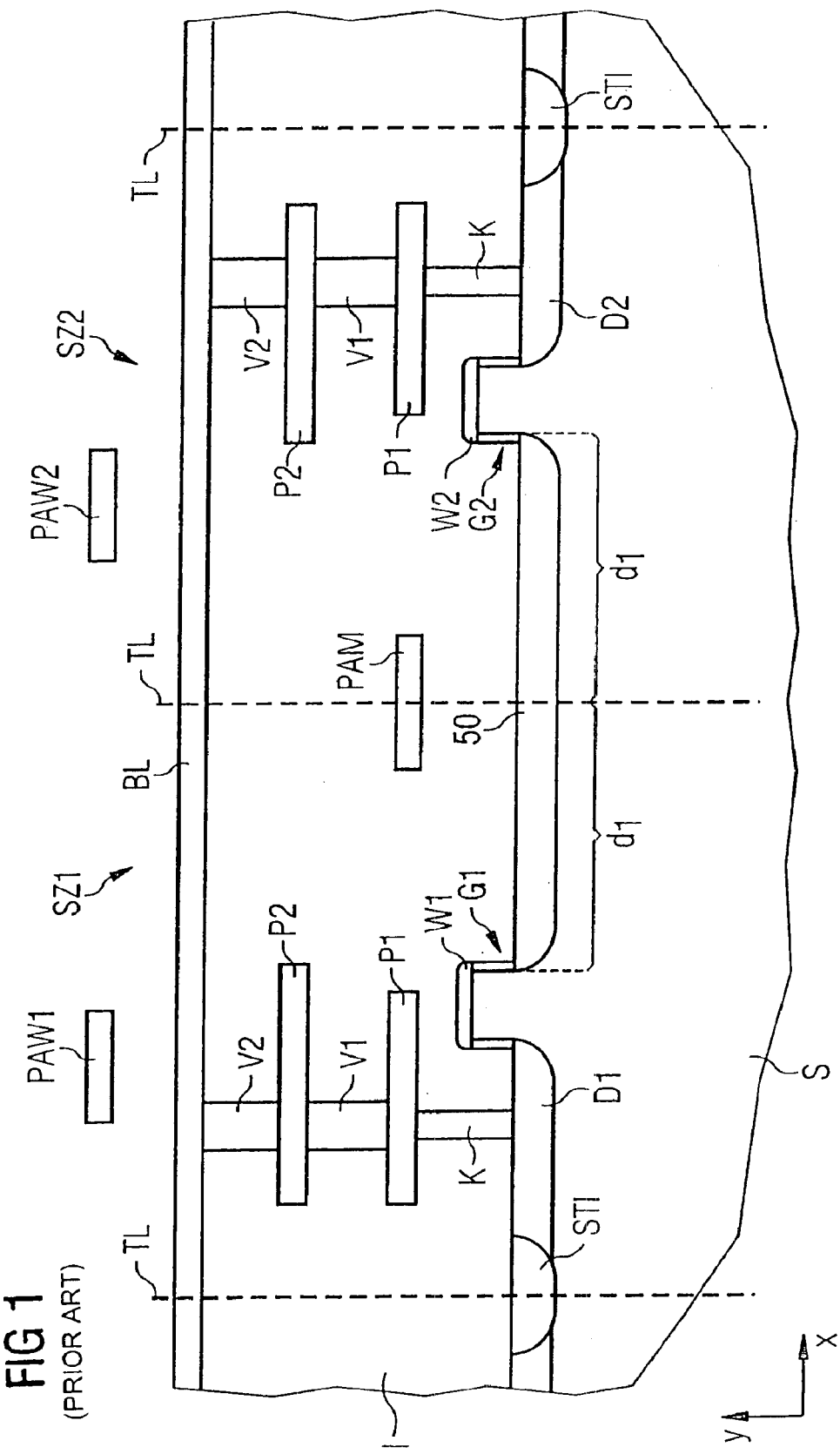
FIG. 1 shows a cross-sectional view of an arrangement of two semiconductor memory components designed according to the state of the art.

The contact areas K, the contact pads P1, P2, and P3, and the via connections V1, V2, and V3 in the two memory cells SZ1 and SZ2 are embedded and produced in an isolation layer I, which can be designed as a multi-layer system. The memory cells SZ1 and SZ2 can therefore be programmed at the latest possible point and especially in a metallization plane which is formed as the last thin metallization plane in the stack of layers built up in the y-direction. A metallization plane of this type is referred to as "thin" when it has a smaller or much smaller dimension in the y-direction than the metallization planes formed above in it in the positive y-direction. In the exemplary embodiment according to FIG. 4, it is also possible for the two row-select/potential-equalization lines PAW1 and PAW2 to be coincident but asymmetric to the separating line TL drawn between the two memory cells SZ1 and SZ2. It must be remembered in this case that the minimum distances $a_1$ to the contact pads P2 and P3 must always be maintained (minimum design rule distances). In this case, an arrangement would result which would have a somewhat larger surface area than the design shown in FIG. 4, but it would still be considerably smaller than the designs according to the state of the art shown in FIGS. 1 and 2. It is also possible for the row-select/potential-equalization lines PAW1 and PAW2 not to be coincident, that is, to be shifted in the x-direction relative to each other (FIG. 4).

As a result of the semiconductor memory component according to the invention, therefore, programming can be carried out at the latest possible point; in particular, programming can be carried out in the last thin metallization plane during the logic production process. Simultaneously, it is possible to achieve a significant reduction in the amount of area required for the semiconductor memory cells of the semiconductor memory components. It is also possible in FIG. 4 for the first row-select/potential-equalization line PAW1 to be provided in the first metallization plane, in which the contact pads P1 are formed. It is also possible for the second row-select/equalization line PAW2 to be formed in the second metallization plane, in which the contact pads P2 are located. The memory cells SZ1 and SZ2 can then be contacted as early as the third metallization plane, in which the bit line BL can be formed.

When the row-select/potential-equalization lines PAW1 and PAW2 are provided in the first and second metallization planes, it is also possible, however, for programming to be carried out in the fourth or higher metallization plane. In the exemplary embodiment according to FIG. 4, programming can also be carried out in a higher plane than the fourth metallization plane. The essential point is that programming can be accomplished in the last thin metallization plane. The thick metallization planes located above—in the positive y-direction—the last thin metallization plane, i.e., the plane possibly used for the programming of the memory cells, are designed for establishing contact with bus lines or with the bus system of an integrated circuit or for example, as bonding planes. The thick metallization planes can have a thickness in the y-direction which, for example, is two-times or four-times greater than the thickness of a thin metallization plane. The contact areas K, the contact pads P1, and the ground potential equalization line PAM can be made of tungsten, for example. The via connections V1, V2, and V3; the contact pads P2 and P3; and the two line select/potential matching PAW1 and PAW2 between the memory cells SZ1 and SZ2 can be made of copper, for example. The bit line BL in the fourth metallization plane can also be made of copper.

FIG. 5 shows a plan view of the layout of the inventive semiconductor component according to FIG. 4. The two row-select/potential-equalization lines PAW1 and PAW2 are arranged one above the other so that they coincide with each other in the z-direction. In the exemplary embodiment shown, the word line W1 is contacted by the second row-select/potential-equalization line PAW2 via the two contact areas KW1. The second word line W2 is contacted by the first row-select/potential-equalization line PAW1 via the contact areas KW2. The word lines W1 and W2 can also be contacted by the two row-select/potential-equalization lines PAW1 and PAW2 in the reverse order. As can be seen in FIG. 5, the drain regions D1 and D2 and the gate regions G1 and G2 of the memory cell transistors are essentially the same in terms of surface area as those in the diagram of FIG. 3. The area of the source region 50 assigned to the two memory cell transistors, however, is greatly reduced. The size in the x-direction of the two memory cell transistors between the outer separating lines TL is reduced in FIG. 5, in comparison with the diagram in FIG. 3, by a width of an equalization line and the minimum design rule distance $a_3$. The diagram in FIG. 4 corresponds to a cross-sectional view along the line BB (in FIG. 5).

In the semiconductor memory component according to the invention, especially a mask-programmable ROM component, the row-select/potential-equalization lines are, seen from the perspective of the memory cell transistors, arranged vertically with respect to each other and are located between the memory cell transistors while extending into both of them at the same time. The row-select/potential-equalization lines are therefore arranged in such a way that they are assigned to two memory cells arranged in one column of a memory cell field. It is especially preferred for the row-select/potential-equalization lines to be nearly coincident with each other in separate planes above the memory cell transistors and thus in the middle and essentially centered between the diffusion region assigned in common to the two memory cell transistors. The two gate regions or word lines of the memory cell transistors of the adjacent memory cells can therefore be contacted by both row-select/potential-equalization lines. Because the row-select/potential-equalization line formed in one metallization plane is centered above the diffusion area assigned to both memory cell transistors of the two adjacent memory cells, the area required for each individual memory cell can be considerably reduced; in particular, it can be reduced by at least a distance equivalent to half of the minimum distance predetermined by the design rules. In addition, as a result of the inventive arrangement of the row-select/potential-equalization lines in particular, the arrangement of the word lines and of the bit lines can be implemented in such a way that the memory cells can be programmed at the latest possible point in the fabrication process in a metallization plane designed as the last thin metallization plane in the entire stack of layers.

Although the invention has been illustrated and described with respect to one or more implementations, alterations and/or modifications may be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A semiconductor memory component, comprising:
   a first memory cell transistor electrically connected to a first selection line;
   a second memory cell transistor electrically connected to a second selection line; and
   a first row-select/potential-equalization line and a second row-select/potential-equalization line,
   wherein the two row-select/potential-equalization lines are arranged vertically one above the other and between the two memory cell transistors.

2. The semiconductor memory component of claim 1, wherein at least one of the two line select/potential equalization lines is equidistance from the first and the second memory cell transistors.

3. The semiconductor memory component of claim 1, wherein at least one of the two row-select/potential-equalization lines is arranged above and centered over a diffusion region of the first and second memory cell transistors, and wherein the diffusion region is shared between the first and second memory cell transistors.

4. The semiconductor memory component of claim 1, wherein the first and second row-select/potential-equalization lines are arranged one above the other so that they are coincident in the vertical direction.

5. The semiconductor memory component of claim 1, wherein the two row-select/potential-equalization lines are formed in different metallization planes.

6. The semiconductor memory component of claim 5, wherein the first row-select/potential-equalization line is formed in the second or third metallization plane, and the second row-select/potential-equalization line is formed correspondingly in the third or second metallization plane above the first and the second memory cell transistors.

7. The semiconductor memory component of claim 1, wherein the first or the second selection line is electrically connected to the first or the second row-select/potential-equalization line, respectively.

8. The semiconductor memory component of claim 1, further comprising a data line selectively coupled to the first and second memory transistors in a metallization plane that is above the metallization planes in which the first and the second row-select/potential-equalization line are located.

9. The semiconductor memory component of claim 1, further comprising:
   a memory cell field in which a plurality of memory cells are arranged in the form of a matrix,
   wherein the measurement cell field has a first and a second row, each with a plurality of measurement cells, each cell with its own memory cell transistor, where memory cell transistors of the first row are electrically connected to the first selection line and the memory cell transistors of the second row are electrically connected to the second selection line, and
   wherein the first selection line is electrically connected only to the first row-select/potential-equalization line, and the second selection line is connected only to the second row-select/potential-equalization line.

10. The semiconductor memory component of claim 1, further comprising:
    a memory cell field in which a plurality of memory cells are arranged in the form of a matrix,
    wherein the memory cell field has a first and a second row, each with a plurality of memory cell transistors, where memory cell transistors of the first row are electrically connected to the first selection line and the memory cell transistors of the second row are electrically connected to the second selection line, and
    wherein both the first and the second selection lines each has at least one electrical connection to the first and an electrical connection to the second row-select/potential-equalization line.

11. A process for producing a semiconductor memory component, comprising:
    forming a first and second memory cell transistor in a substrate;
    electrically connecting the first memory cell transistor to a first selection line, and the second memory cell transistor to a second selection line (WL2);
    forming a first row-select/potential-equalization line and a second row-select/potential equalization line, wherein the first and second row-select/potential-equalization lines are arranged vertically one above the other and between the two memory cell transistors.

12. The process of claim 11, wherein at least one of the two row-select/potential-equalization lines is equidistant from the two memory cell transistors.

13. The process of claim 11, wherein at least one of the two row-select/potential-equalization lines is above and centered over a diffusion region of the first and second memory cell transistors, and wherein the diffusion region is shared between the first and second memory cell transistors.

14. The process of claim 11, wherein the first and the second row-select/potential-equalization lines are arranged one above the other so that they are coincident in the vertical direction.

15. The process of claim 11, wherein the first and the second row-select/potential-equalization lines are formed in different metallization planes.

16. The process of claim 11, further comprising forming a data line in a metallization plane above the memory cell transistors, wherein the data line metallization plane is formed above the metallization planes in which the row-select/potential-equalization lines are formed.

17. The process of claim 11, further comprising:

forming a plurality of memory cells in each of a first and second row of a memory cell field designed in the form of a matrix;

wherein a memory cell transistor is formed in each memory cell and has a row-select/potential-equalization line associated therewith, and the memory cell transistors of the first row are electrically connected to a first selection line, and the memory cell transistors of the second row are electrically connected to a second selection line; and electrically connecting the first selection line to the row-select/potential-equalization lines of the memory-cell transistors in the first row, and electrically connecting the second selection line to the row-select/potential-equalization lines of the memory cell transistors in the second row.

18. The process of claim 17, wherein the first selection line is electrically connected to the row-select/potential-equalization lines of the second row, and the second selection line is electrically connected to the row-select/potential-equalization lines of the first row.

* * * * *